(12) United States Patent
Tsai et al.

(10) Patent No.: US 9,928,905 B2
(45) Date of Patent: Mar. 27, 2018

(54) SENSING DEVICE OF NONVOLATILE RESISTIVE MEMORY

(71) Applicant: Nuvoton Technology Corporation, Hsinchu (TW)

(72) Inventors: Hsi-Jung Tsai, Hsinchu (TW); Chia-Ching Lu, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 27 days.

(21) Appl. No.: 15/073,270

(22) Filed: Mar. 17, 2016

(65) Prior Publication Data
US 2016/0322100 A1 Nov. 3, 2016

(30) Foreign Application Priority Data
Apr. 28, 2015 (TW) .............................. 104113476 A

(51) Int. Cl.
| | |
|---|---|
| *G11C 11/00* | (2006.01) |
| *G11C 13/00* | (2006.01) |
| *G11C 29/02* | (2006.01) |
| *G11C 29/24* | (2006.01) |
| *G11C 7/04* | (2006.01) |

(52) U.S. Cl.
CPC ........ *G11C 13/004* (2013.01); *G11C 13/0069* (2013.01); *G11C 29/021* (2013.01); *G11C 29/028* (2013.01); *G11C 29/24* (2013.01); *G11C 7/04* (2013.01); *G11C 2013/0078* (2013.01)

(58) Field of Classification Search
CPC combination set(s) only.
See application file for complete search history.

(56) References Cited

U.S. PATENT DOCUMENTS

| | | | |
|---|---|---|---|
| 2010/0103726 A1* | 4/2010 | Bae ........................ | G11O 5/143 365/163 |
| 2010/0244023 A1 | 9/2010 | Parkinnson | |
| 2013/0094281 A1 | 4/2013 | Liu et al. | |
| 2014/0063900 A1* | 3/2014 | Heller .................... | G01N 25/02 365/148 |

OTHER PUBLICATIONS

Taiwanese Office Action dated Oct. 21, 2016, as issued in corresponding Taiwan Patent Application No. 104113476 (5 pages).

* cited by examiner

*Primary Examiner* — Mohammed A Bashar
(74) *Attorney, Agent, or Firm* — Muncy, Geissler, Olds & Lowe P.C.

(57) ABSTRACT

An embodiment of the invention provides a sensing device. The sensing device includes a controller, a Resistive random memory sensor, an access circuit and a comparator circuit. The access circuit accesses the Resistive random memory sensor. The comparator circuit is coupled to the controller and the access circuit. The controller writes a predetermined data to the Resistive random memory sensor via the access circuit. After a predetermined condition, the access circuit reads a first data from the Resistive random memory sensor. The comparator circuit compares the first data with the predetermined data and transmits a comparison result to the controller. The controller determines whether an abnormal condition occurs based on the comparison result.

7 Claims, 8 Drawing Sheets

SENSING DEVICE OF NONVOLATILE RESISTIVE MEMORY

CROSS REFERENCE TO RELATED APPLICATIONS

This Application claims priority of Taiwan Patent Application No. 104113476, filed on Apr. 28, 2015, the entirety of which is incorporated by reference herein.

BACKGROUND OF THE INVENTION

Field of the Invention

The present invention relates to a sensing device, and in particular relates to a sensing device of resistive memory.

Description of the Related Art

With the growth in the use of portable electronic devices, the demand for non-volatile memory has increased. Among the various kinds of non-volatile memory, phase change memory is the most competitive next generation non-volatile memory due to its higher speed, lower power consumption, higher capacity, reliability, easier process integration and lower cost.

BRIEF SUMMARY OF THE INVENTION

An embodiment of the invention provides a sensing device. The sensing device includes a controller, a Resistive random memory sensor, an access circuit and a comparator circuit. The access circuit accesses the Resistive random memory sensor. The comparator circuit is coupled to the controller and the access circuit. The controller writes a predetermined data to the Resistive random memory sensor via the access circuit. After a predetermined condition, the access circuit reads a first data from the Resistive random memory sensor. The comparator circuit compares the first data with the predetermined data and transmits a comparison result to the controller. The controller determines whether an abnormal condition occurs based on the comparison result.

Another embodiment of the invention provides a sensing device including a controller, a writing circuit, a first resistive random memory sensor, a second resistive random memory sensor, a read circuit and a comparator circuit. The writing circuit outputs a first writing voltage corresponding to a first logic data, and a second writing voltage corresponding to a second logic data. The first writing voltage is smaller than the second writing voltage. The first resistive random memory sensor stores a first predetermined data to determine whether the first writing voltage is larger than a first predetermined voltage. The second resistive random memory sensor stores a second predetermined data to determine whether the second writing voltage is larger than a second predetermined voltage. The read circuit is configured to read data stored in the first resistive random memory sensor and the second resistive random memory sensor. After a predetermined condition, the read circuit read a first data from the first resistive random memory sensor and a second data from the second resistive random memory sensor. The comparator circuit compares first data with the first predetermined data to output a first comparison result, and compares second data with the second predetermined data to output a second comparison result. The controller adjusts the first writing voltage and the second writing voltage based on the first comparison result and the second comparison result.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The SET and RESET operations are mainly achieved by inputting two current pulses with different current magnitudes to the phase change memory to switch the phase change memory between an amorphous state and a crystalline state. According to Ohm's Law, when the current is input to the phase change memory, the phase change memory is heated, so the phase change memory may thus be crystallized or fused based on different currents. Based on the described, the logic state of the phase change memory can be switched by inputting different currents, enabling data storage.

Figure 1:
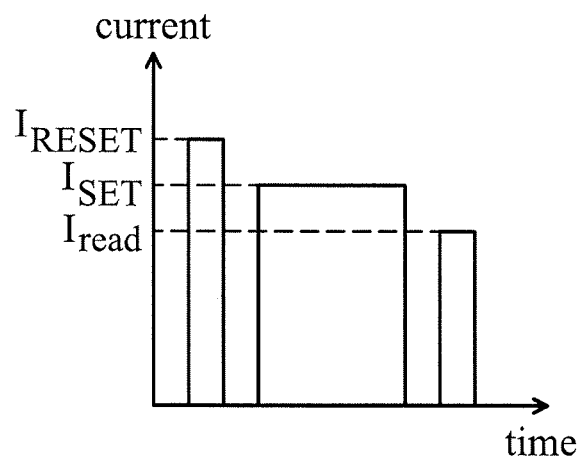
FIG. 1 is a schematic diagram showing the writing current pulse and the reading current pulse of the phase change memory.

FIG. 1 is a schematic diagram showing the writing current pulse and the reading current pulse of the phase change memory. When a RESET operation is applied to the phase change memory, a reset current $I_{RESET}$ with high amplitude and short duration is applied, athe phase change memory is thus fused because the temperature of the phase change memory exceeds the fusion temperature $T_m$ of the phase change material of the phase change memory. When the temperature of the phase change memory decreases, the state of the phase change memory is transformed to the amorphous state because of an insufficient cool down period, and the phase change memory in the amorphous state has high resistance. When a SET operation is applied to the phase change memory, a set current $I_{SET}$ with lower amplitude and longer duration is applied. The phase change memory is heated by the set current $I_{SET}$, and the temperature of the phase change memory is held substantially between the fusion temperature $T_m$ and a crystallization temperature $T_c$ of the phase change material used by the phase change memory. During the SET operation, the fused phase change memory has sufficient time for crystallizing and the phase change memory in the crystallization state has low resistance. As described, the phase change memory respectively stores data with logic state 1 and 0 by the RESET operation and the SET operation, such as the write operation and erase operation for memory. When reading the phase change memory, a read current $I_{READ}$, the amplitude of which is less than the set current $I_{SET}$, is applied to the phase change memory to determine the logic state of the data stored in the phase change memory based on the sensed resistance.

Figure 2:
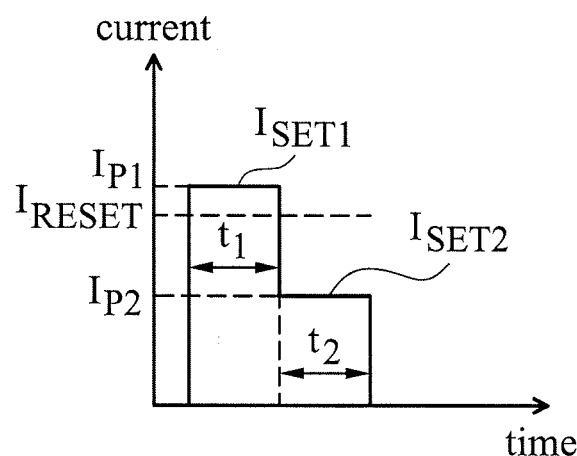
FIG. 2 is a schematic diagram of a convention SET signal for the phase change memory.

FIG. 2 is a schematic diagram of a convention SET signal for the phase change memory. The SET signal comprises a first crystallization current pulse $I_{SET1}$ and a second crystallization current pulse $I_{SET2}$. The first crystallization current pulse $I_{SET1}$ has a first peak $I_{P1}$ and the duration of the first peak $I_{P1}$ is a first time period t1. The second crystallization current pulse $I_{SET2}$ has a second peak $I_{P2}$ and the duration of the second peak is a second time period t2.

The conventional SET signal is generated by combining two current pulses with different peaks, and the conventional SET operation is achieved by inputting a SET signal, such as the SET signal illustrated in FIG. 2, to the phase change memory. Comparing the first crystallization current pulse $I_{SET1}$ and the second crystallization current pulse $I_{SET2}$, the first peak current is higher than the second peak current, and the first time period is shorter than the second time period. Therefore, when the first crystallization current pulse $I_{SET1}$ is input to the phase change memory, the phase change material of the phase change memory is quickly heated, and partial phase change material is crystallized. Then, the second crystallization current pulse $I_{SET2}$ is input to the phase change memory with lower current and longer time, allowing the phase change material to completely crystallized. According to the described operation, the reliability and the uniformity of the phase change memory can be increased.

Figure 3:
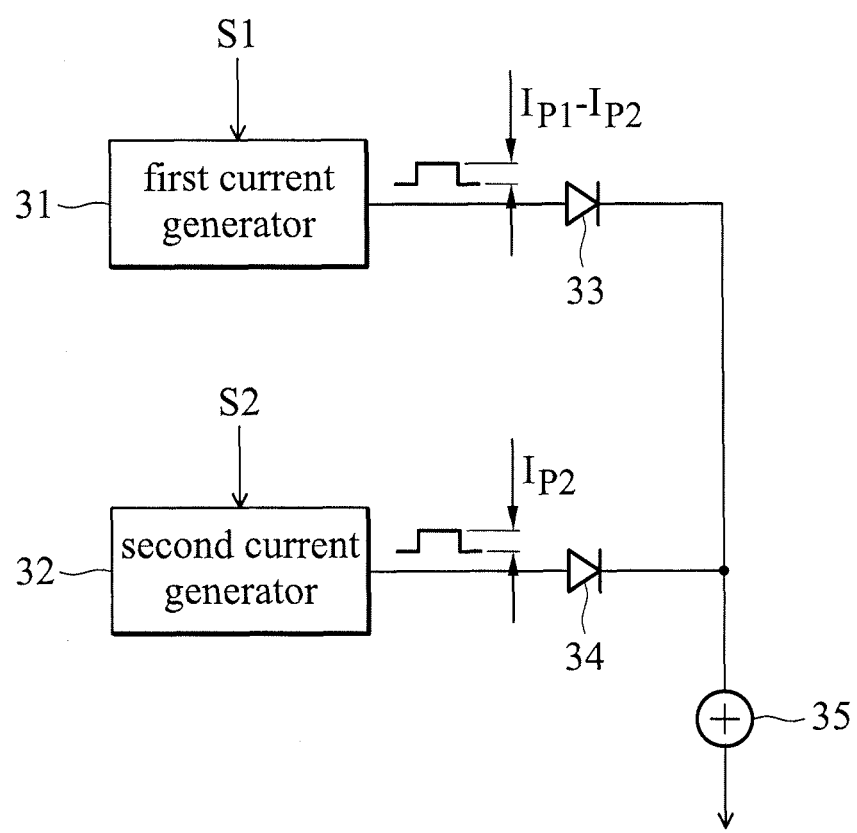
FIG. 3 is a schematic diagram of a current generator outputting the SET signal shown in FIG. 2.

FIG. 3 is a schematic diagram of a current generator outputting the SET signal shown in FIG. 2. The first current generator 31 and the second current generator 32 coupled to the adder 35 respectively via a first diode 33 and a second diode 34. The first current generator 31 outputs a first current pulse having an amplitude of $(I_{P1}-I_{P2})$, and the second current pulse generator outputs a second current pulse having an amplitude of $I_{P2}$. The first current generator 31 and the second current generator 32 simultaneously output the first current pulse and the second current pulse for a duration time t1 based on the control signals S1 and S2. Then, the control signal S1 disables the first current generator 31 to stop outputting the first current pulse and the second control signal S2 controls the second current generator 32 to output the second current pulse for a duration time t2. According to the described operation, the SET signal illustrated in FIG. 2 can be generated.

Although FIGS. 1-3 illustrate operation of the memory with current, a person skilled in the art will understand the current can be replaced by a voltage to achieve the same result shown in FIG. 1-3. Moreover, the characteristic of the phase change memory shown in FIGS. 1-3 can also be found in the resistive memory.

Figure 4:
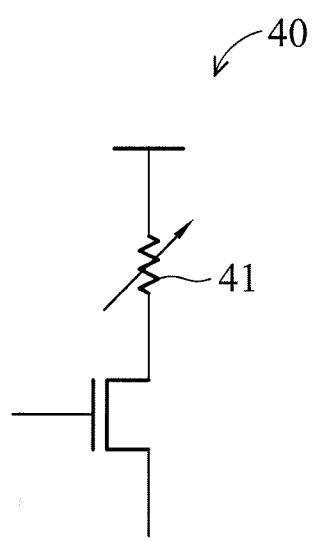
FIG. 4 is a schematic diagram of a memory cell of RRAM (resistive random access memory).

FIG. 4 is a schematic diagram of a memory cell of RRAM (resistive random access memory). Memory cell 40 comprises transistor T1 and an adjustable resistive element 41, such as a metal-insulator-metal (MIM) element. The resistance of the MIM element 41 can be changed by applying a bias voltage via the node N. When the memory cell 40 is read by a reading voltage applying to the MIM element, the data state of data stored in the memory cell 40 is determined by current passing through the MIM element. However, due to the characteristic of the RRAM, insufficient writing voltage may cause the data cannot be correctly written. Moreover, the abnormal high temperature may cause the data stored in the RRAM changed due to the characteristic of the RRAM. For example, if a maximum operation temperature of the RRAM is 200° C., the data stored in the RRAM may be error when the temperature of the RRAM is higher than 200° C.

Since the resistive memory element may be error due to the temperature, the current or the voltage, a proposed sensor using the resistive memory is provided in the present application.

Figure 5:
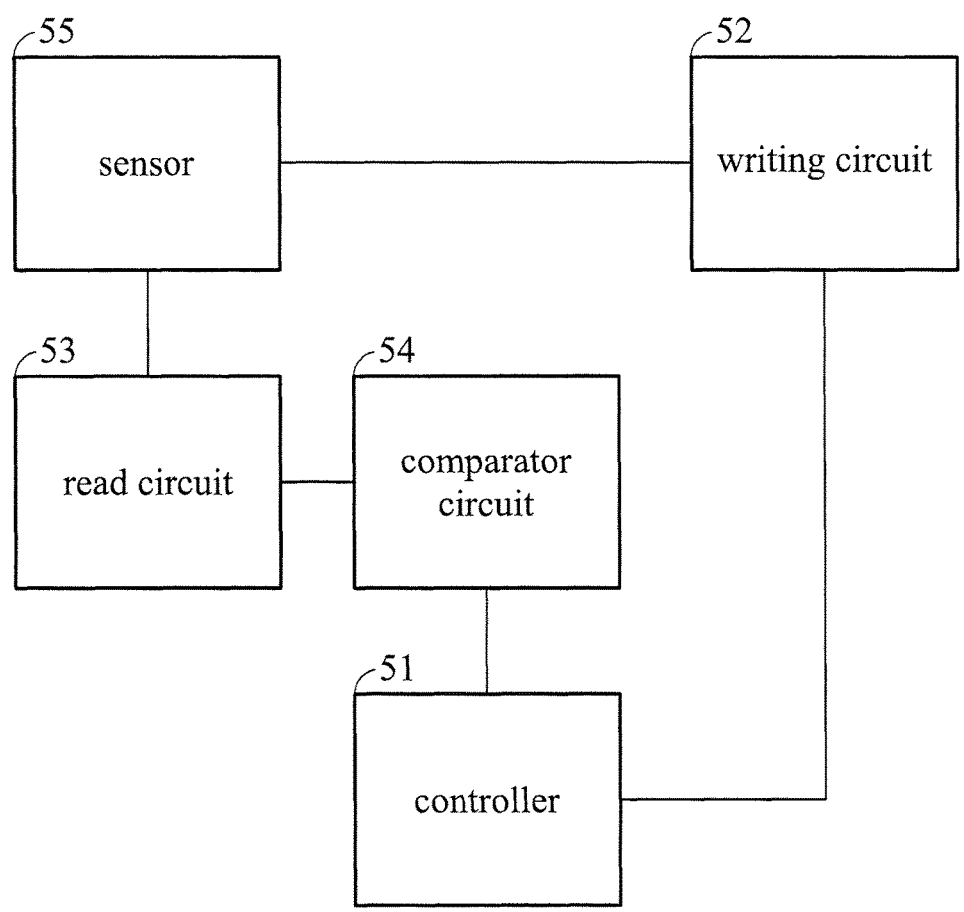
FIG. 5 is a schematic diagram of a sensing system using a sensor made by a resistive random access memory according to an embodiment of the invention.

FIG. 5 is a schematic diagram of a sensing system using a sensor made by a resistive random access memory according to an embodiment of the invention. The sensing system may be a part of a RRAM module. The sensing system comprises a controller 51, a writing circuit 52, a read circuit 53, a comparator circuit 54 and a sensor 55 including a resistive memory. The controller 51 writes a predetermined data to the resistive memory of the sensor 55. After a predetermined situation, the controller 51 controls the read circuit 53 to read data stored in the resistive memory of the sensor 55, and the controller 51 transmits the read data to the comparator circuit 54 for comparison. If the read data is the same as the predetermined data, it represents a normal situation. If the read data is not the same as the predetermined data, an abnormal situation is occurred.

For example, the RRAM modules or electronic devices with the sensor including the resistive memory need a long-distance transportation, and the operation temperature of the RRAM modules or the electronic devices is between 0° C. to 100° C. Once the temperature during the transportation exceeds the temperature range, for example a power failure of an air-conditioned cabin loading the RRAM modules or electronic devices, the data stored in the RRAM modules or resistive memory of the electronic devices may be damaged. In this embodiment, the temperature anomaly is only an example for illustration, a person skilled in the art can design different sensors with different temperature tolerance range to detect different temperature anomalies. The sensing system in FIG. 5 is able to detect temperature anomalies during transportation.

When writing data to the resistive memory, sufficient voltage or current is required to be applied to the resistive memory. The sensing system in FIG. 5 is able to detect whether a situation of insufficient voltage or current is occurred, and the sensing system is able to calibrate the insufficient voltage or current.

Figure 6:
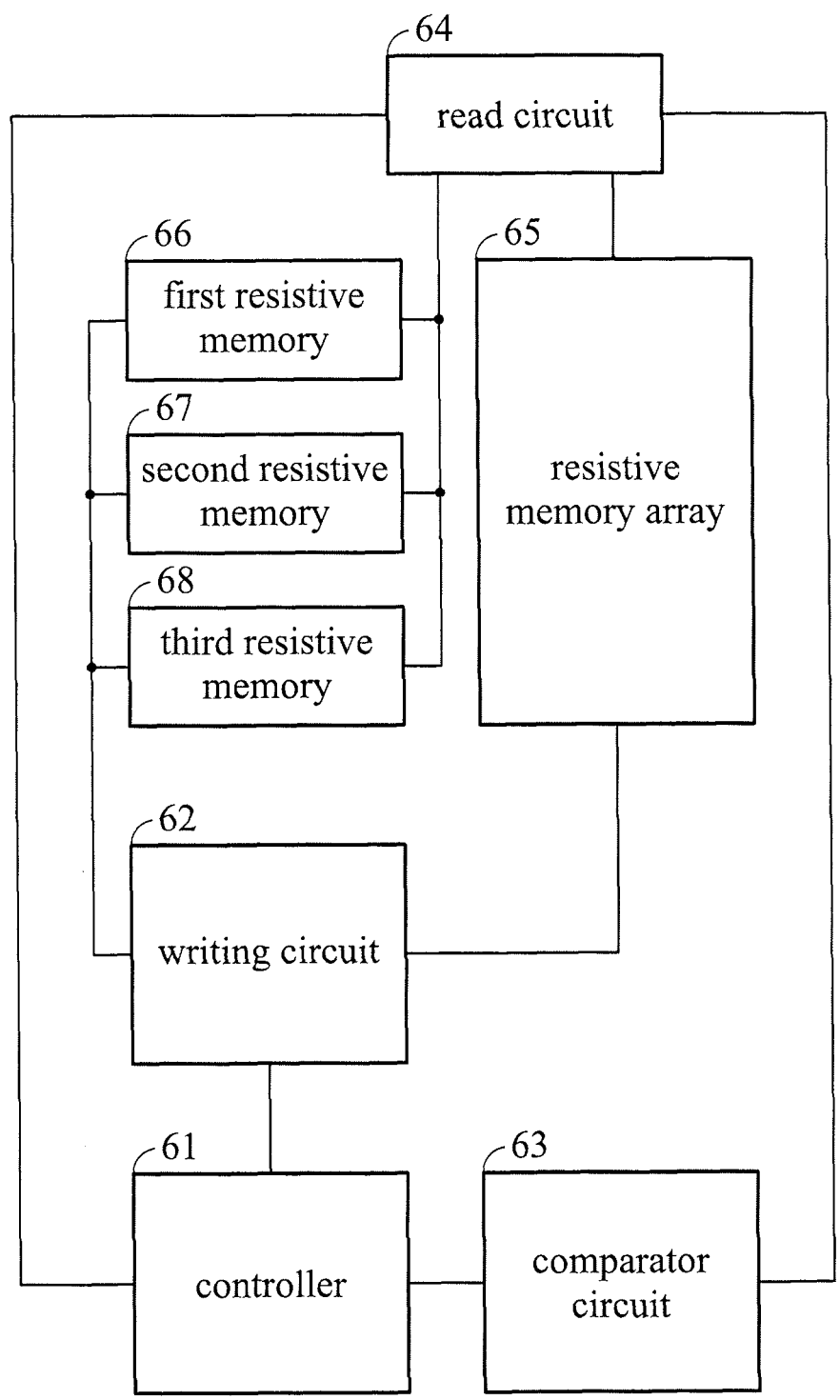
FIG. 6 is a schematic diagram of a resistive memory device with voltage sensing mechanism according to an embodiment of the invention.

FIG. 6 is a schematic diagram of a resistive memory device with voltage sensing mechanism according to an embodiment of the invention. The resistive memory device with voltage sensing mechanism comprises a controller 61, a writing circuit 62, a comparator circuit 63, a read circuit 64, a resistive memory array 65, a first resistive memory 66, a second resistive memory 67 and a third resistive memory 68. In this embodiment, the writing circuit 62 outputs a voltage $V_{RESET1}$ to the resistive memory array 65 and the first resistive memory 66 to write a data of logic 0, and the writing circuit 62 outputs a voltage $V_{SET1}$ to the resistive memory array 65 and the first resistive memory 66 to write a data of logic 1. The writing circuit 62 outputs a voltage $V_{RESET2}$ to the second resistive memory 67 to write a data of logic 0, and the writing circuit 62 outputs a voltage $V_{SET2}$ to the second resistive memory 67 to write a data of logic 1. The writing circuit 62 outputs a voltage $V_{RESET3}$ to the third resistive memory 68 to write a data of logic 0, and the writing circuit 62 outputs a voltage $V_{SET3}$ to the third resistive memory 68 to write a data of logic 1.

In another embodiment, voltages output by the writing circuit 62 to the resistive memory array 65 to write data of logic 1 and 0 are different from voltages output by the writing circuit 62 to the first resistive memory 66 to write data of logic 1 and 0. Moreover, voltages output by the writing circuit 62 to the resistive memory array 65 to write data of logic 1 and 0 are different from voltages output by the writing circuit 62 to the first resistive memory 66, the second resistive memory 67 or the third resistive memory 68 to write data of logic 1 and 0. In another embodiment, voltages output by the writing circuit 62 to the resistive memory array 65 to write data of logic 1 and 0 are the same as voltages output by the writing circuit 62 to one of the first resistive memory 66, the second resistive memory 67 or the third resistive memory 68 to write data of logic 1 and 0. The described voltages comply with the following rules:

$V_{RESET1} > V_{SET1}$
$V_{RESET1} > V_{RESET2} > V_{RESET3}$
$V_{SET1} > V_{SET2} > V_{SET3}$

In another embodiment, relations between voltages $V_{RESET2}$ and $V_{SET2}$, and $V_{RESET3}$ and $V_{SET3}$ are similar to rules of $V_{RESET1}$ and $V_{SET1}$. In general situation, the voltage output by the writing circuit 62 is sufficient to write data, however, insufficient writing voltages still may be occurred. By using the first resistive memory 66, the second resistive memory 67 or the third resistive memory 68, the situations of insufficient writing voltages can be detected and calibrated. In one embodiment, voltages output by the writing circuit 62 to the resistive memory array 65 to write data of logic 1 and 0 are different from voltages output by the writing circuit 62 to the first resistive memory 66, the second resistive memory 67 and the third resistive memory 68 to write data of logic 1 and 0. The writing circuit 62 uses a voltage divider circuit to output different voltages to the resistive memory array 65, the first resistive memory 66, the second resistive memory 67 and the third resistive memory 68. According to the described mechanism, the size of the first resistive memory 66, the second resistive memory 67 and the third resistive memory 68 can be reduced and a total layout area is reduced accordingly.

Furthermore, three sensors are illustrated in the embodiment, but not limit the invention thereto. A person skilled in the art can design different number of sensors based on the design requirement. Moreover, the writing circuit 62 can simultaneously or sequentially write data to the first resistive memory 66, the second resistive memory 67 and the third resistive memory 68. The detail operations of the embodiment are described in the following.

When the writing circuit 62 writes data to the resistive memory array 65, the controller 61 simultaneously controls the writing circuit 62 to write predetermined data to the first resistive memory 66, the second resistive memory 67 and the third resistive memory 68. In one embodiment, the data written to the resistive memory array 65 is different from the predetermined data written to the first resistive memory 66, the second resistive memory 67 and the third resistive memory 68. In one embodiment, the first resistive memory 66 stores only 1-bit data, and the second resistive memory 67 and the third resistive memory 68 stores 2-bits data. Therefore, the data lengths of data written to the first resistive memory 66, the second resistive memory 67 and the third resistive memory 68 are different. Furthermore, logic levels of data written to the first resistive memory 66, the second resistive memory 67 and the third resistive memory 68 are different. In another embodiment, logic levels of data written to the first resistive memory 66, the second resistive memory 67 and the third resistive memory 68 are the same. The first resistive memory 66, the second resistive memory 67 and the third resistive memory 68 pre-store data with logic 1 or logic 0, and the predetermined data written to the first resistive memory 66, the second resistive memory 67 and the third resistive memory 68 is logic 0 or logic 1. In one embodiment, the pre-stored data of the first resistive memory 66, the second resistive memory 67 and the third resistive memory 68 are set by manufacture before shipping. In another embodiment, the pre-stored data of the first resistive memory 66, the second resistive memory 67 and the third resistive memory 68 are set before accessing the resistive memory array 65.

After writing data to the resistive memory array 65, the controller 61 controls the read circuit 64 to read data stored in the first resistive memory 66, the second resistive memory 67 and the third resistive memory 68. The comparator 63 compares read data from the read circuit 64 with a predetermined data, i.e., the pre-stored data, to determine whether an error occurred during the writing procedure of the resistive memory array 65. For example, assuming pre-stored data in the first resistive memory 66 and the second resistive memory 67 is 1 and the data to be written to the first resistive memory 66 and the second resistive memory 67 is 0, the controller 61 finds that the data stored in the first resistive memory 66 is still 1 and the data stored in the second resistive memory 67 becomes 0. Thus, the controller 61 can know that the RESET voltage output by the writing circuit 62 is smaller than $V_{RESET1}$ and greater than $V_{RESET2}$. The controller 61 further noted that the RESET operation applied to the resistive memory array 65 may cause error and the user can know the situation of insufficient voltage.

In another embodiment, the pre-stored data in the first resistive memory 66, the second resistive memory 67 and the third resistive memory 68 is 1 and the data to be written to the first resistive memory 66, the second resistive memory 67 and the third resistive memory 68 is 0. After a predetermined condition, the controller 61 finds that the data stored in the first resistive memory 66 and the second resistive memory 67 is still 1, and the data stored in the third resistive memory 68 is changed to 0. Thus, the controller 61 can know that the RESET voltage output by the writing circuit 62 is smaller than $V_{RESET2}$ and greater than $V_{RESET3}$. The controller 61 further noted that the RESET operation applied to the resistive memory array 65 may cause error Similarly, a person skilled in the art can use other resistive memory to determine whether the SET voltage output by the writing circuit 62 is correct. In another embodiment, the first resistive memory 66, the second resistive memory 67 and the third resistive memory 68 are a part of the resistive memory array 65 and do not stored user's input data.

Figure 7:
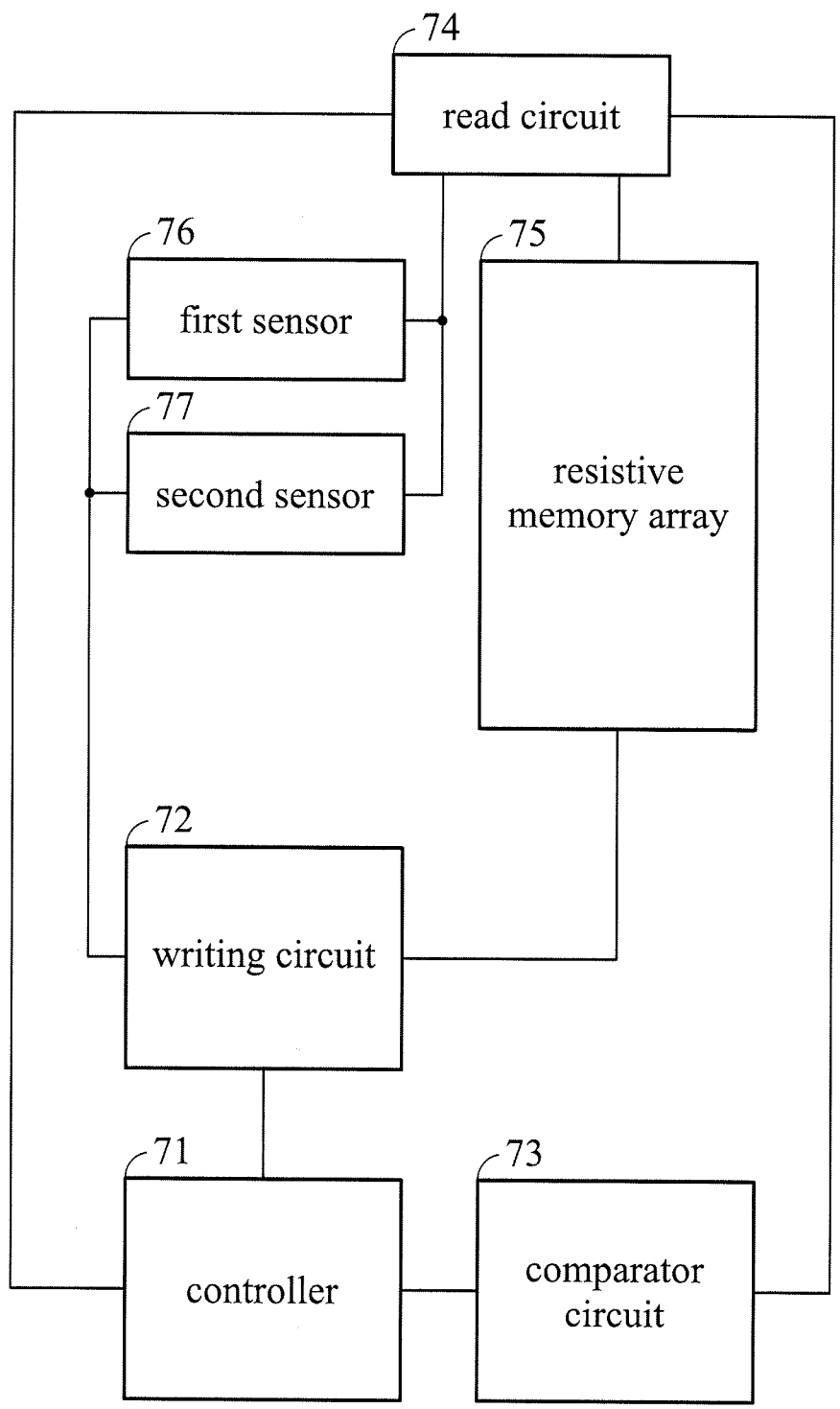
FIG. 7 is a schematic of a resistive memory with a proposed voltage sensing mechanism according to an embodiment of the invention.

FIG. 7 is a schematic of a resistive memory with a proposed voltage sensing mechanism according to an embodiment of the invention. The resistive memory with the proposed voltage sensing mechanism comprises a controller 71, a writing circuit 72, a comparator circuit 73, a read circuit 74, a resistive memory array 75, a first sensor 76 and a second sensor 77. In this embodiment, the first sensor 76 determines whether the RESET voltage output by the writing circuit 72 is correct, and the second sensor 77 determines whether the SET voltage output by the writing circuit 72 is correct. The first sensor 76 and the second sensor 77 are made by a plurality of resistive memory cells (please refer to the first resistive memory 66, the second resistive memory 67 and the third resistive memory 68 shown in FIG. 6). In this embodiment, the resistive memory cells of the first sensor 76 pre-stores data of logic 1 and the resistive memory cells of the second sensor 77 pre-stores data of logic 0.

When the writing circuit 72 writes a first data to the resistive memory array 75, the writing circuit 72 writes a data of logic 0 to the resistive memory cells of the first sensor 76 and a data of logic 1 to the resistive memory cells of the second sensor 77. After the writing circuit 72 writes the first data to the resistive memory array 75, the controller 71 controls the read circuit 74 to read data of resistive memory cells of the first sensor 76 and the second sensor 77, and transmits the read data to the comparator circuit 74 to determine whether the data stored in the resistive memory cells of the first sensor 76 and the second sensor 77 is correct. If correct, the first data is correctly written to the resistive memory array 75. If the read data is not the same as the data stored in the resistive memory cells of the first sensor 76 and the second sensor 77, the controller 71 outputs a calibration signal to the writing circuit 72 to adjust its output voltage or current.

Take the first resistive memory 66, the second resistive memory 67 and the third resistive memory 68 shown in FIG. 6 for example, when the controller 61 determines that the RESET voltage output by the writing circuit 62 is smaller than $V_{RESET1}$ and greater than $V_{RESET2}$, the controller 61 outputs a calibration signal to the writing circuit 62 to adjust its output RESET voltage to be greater than $V_{RESET1}$. According to the described mechanism, the controller 61 and 71 can know whether the writing procedure is correct and can adjust the output voltage of the writing circuit 62 or 72 based on a comparison result.

In this embodiment, the resistive memory cells of the first sensor 76 pre-stores data of logic 1 and the resistive memory cells of the second sensor 77 pre-stores data of logic 0. The controller 71 controls the writing circuit 72 to write data of logic 0 to the resistive memory cells of the first sensor 76, and to write data of logic 1 to the resistive memory cells of the second sensor 77 for testing. If the testing is correct, the resistive memory cells of the first sensor 76 now stores data of logic 0 and the resistive memory cells of the second sensor 77 now stores data of logic 1. The first sensor 76 is originally designed to determine whether the RESET voltage output by the writing circuit 72 is correct, and the second sensor 77 is designed to determine whether the SET voltage output by the writing circuit 72 is correct. After the testing, the first sensor 76 determines whether the SET voltage output by the writing circuit 72 is correct, and the second sensor 77 determines whether the RESET voltage output by the writing circuit 72 is correct.

In another embodiment, each time the first sensor 76 and the second sensor 77 finish sensing procedure, or the pre-stored data in the first sensor 76 and the second sensor 77 is changed, the controller 71 controls the writing circuit 72 to write the predetermined to the resistive memory cells of the first sensor 76 and the second sensor 77.

In another embodiment, the first sensor 75 and the second sensor 77 can operate independently to check whether the output voltage of the writing circuit 72 is correct. It means that the controller 72 can controls the writing circuit 72 to write data to the first sensor 75 and the second sensor 77 without writing data to the resistive memory array 75.

Figure 8:
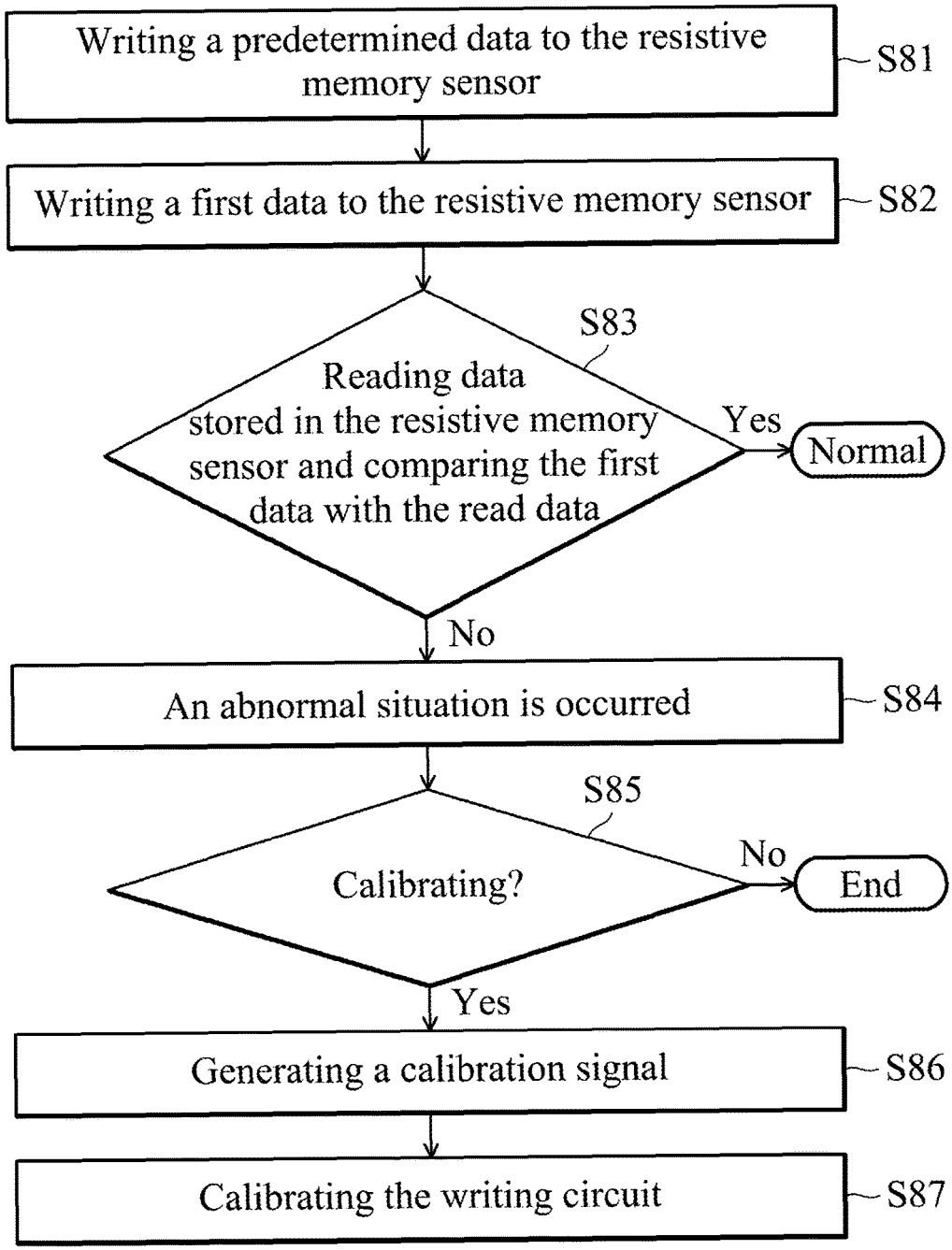
FIG. 8 is a flowchart of an operation method for a resistive memory sensor according to an embodiment of the invention.

FIG. 8 is a flowchart of an operation method for a resistive memory sensor according to an embodiment of the invention. In step S81, a writing circuit writes a predetermined data to the resistive memory sensor. In step S82, the writing circuit writes a first data to the resistive memory sensor, wherein the first data is an inverse data of the predetermined data. For example, the predetermined data is 0, and the first data is 1. If the predetermined data is 1, the first data is 0. In another embodiment, step S82 can be passed. For example, if the resistive memory sensor is used to detect temperature variation, step S82 can be passed, and step S83 is executed after step S81.

In step S83, a read circuit reads data stored in the resistive memory sensor and transmits the read data to a comparator circuit. The comparator circuit compares the first data with the read data or compares the read data with a predetermined data to generate a comparison result. The comparator circuit transmits the comparison result to the controller. In step S84, the controller determines whether the first data is correctly written in the resistive memory sensor. If the first data is the same as the read data, the first data is correctly written in the resistive memory sensor. If the first data is different from the read data, step S85 is executed.

In step S84, the controller can determines whether an abnormal situation is occurred, and determines the abnormal situation is a temperature anomaly, a voltage anomaly or a current anomaly. The embodiment describes the three anomalies, but the limits the invention thereto. A person skilled in the art can design different sensors according to the characteristic of the resistive memory and abnormal situations. In step S84, if the controller determines the abnormal situation is a voltage anomaly or a current anomaly, step S85 is executed to determine whether to calibrate the voltage or current. If the voltage or the current is not needed to be calibrated, the operation method ends. Generally speaking, the resistive memory sensor is embedded in a memory module, and the controller determines to calibrate the voltage or the current further based on a status of a memory array of the memory module. For example, if a number of failure memory cells of the memory array is more than a predetermined value or a failure ratio of the memory is greater than a predetermined ratio, no calibration procedure is processed.

In step S86, the controller generates a calibration signal based on the comparison result to adjust the voltage or current output by the writing circuit. Then, the controller transmits the calibration signal to the writing circuit. In step S87, the writing circuit adjusts the output voltage or current based on the calibration signal.

Figure 9:
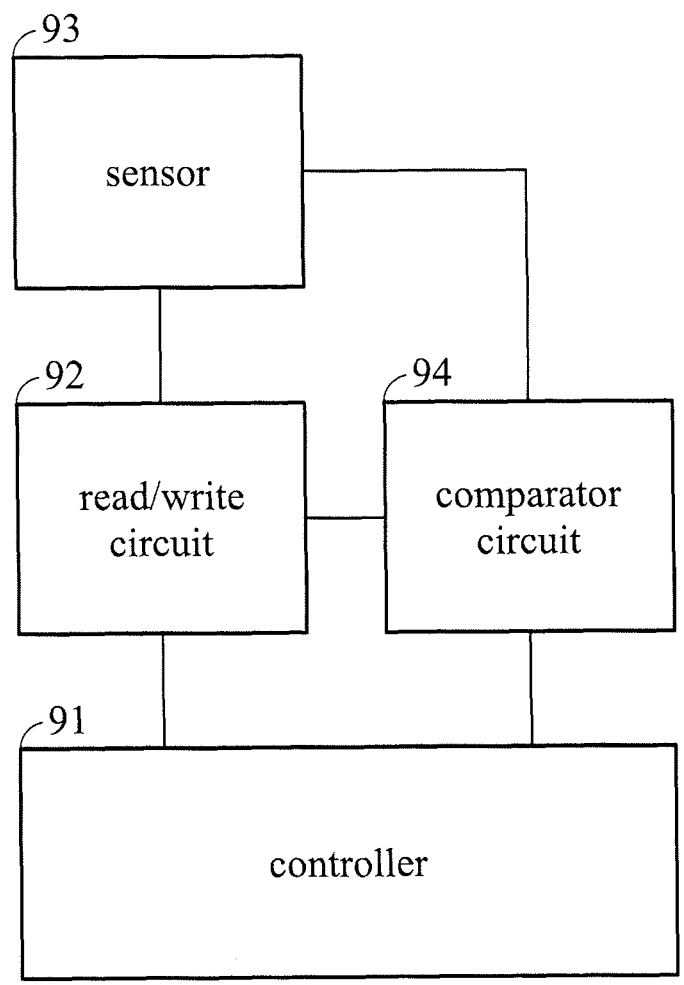
FIG. 9 is a schematic diagram of a sensing apparatus made by a resistive memory according to another embodiment of the invention.

FIG. 9 is a schematic diagram of a sensing apparatus made by a resistive memory according to another embodiment of the invention. The sensing apparatus comprises a controller 91, a access circuit 92, a sensor 93 and a comparator circuit 94. The sensor is made by a resistive memory comprising at least one memory cell. The controller 91 writes a first data to the sensor 93 by the access circuit 92. After a predetermined condition, a long-distance transport or a writing operation for example, the access circuit 92 reads a read data stored in the resistive memory of the sensor 93 and transmits the read data to the comparator circuit 94. The comparator circuit 94 compares the first data with the read data and transmits a comparison result to the controller 91. The controller 91 determines whether an abnormal situation is occurred based on comparison result and whether a further action is need. The detail can be referred to the flowchart of FIG. 8. A person skilled in the art can determine what to do based on the comparison result of the first data and the read data or another comparison result of the read data and a predetermined data.

In the embodiment, if the first data is different from the read data, it means an abnormal condition occurred. In another embodiment, if the first data is the same as the read data, it means an abnormal condition occurred.

In embodiments of the present application, the sensor made by the resistive memory works without additional circuits. Since the sensor made by the resistive memory and the resistive memory array can be manufactured in the same process, the sensor can preciously determine whether there is an abnormal situation occurred in the resistive memory array. Moreover, when the voltage or temperature is changed, it may cause the reading voltage or writing voltage become abnormal, and the RESET operation or the SET operation becomes abnormal accordingly. By using the proposed sensing apparatus which does not require additional circuits or power, the temperature variation, voltage variation, and/or current variation can be easily detected, and the proposed sensing apparatus is helpful for reducing the weight of RRAM module.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensing device, configured to sense a resistive memory array, the resistive memory array has a first writing voltage corresponding to a first logic data, and the sensing device comprising:
   a controller;
   a resistive random memory sensor having a second writing voltage corresponding to the first logic data;
   an access circuit configured to access the resistive random memory sensor and the resistive memory array;
   a comparator circuit coupled to the controller and the access circuit, wherein the controller is configured to write a predetermined data to the resistive random memory sensor by the access circuit, after a predetermined condition, the access circuit reads a first data from the resistive random memory sensor, the comparator circuit compares the predetermined data with the first data and transmits a comparison result to the controller, and the controller determines whether an abnormal situation occurs based on the comparison result,
   wherein voltage level of the first writing voltage is different from voltage level of the second writing voltage,
   wherein the resistive random memory sensor senses an output voltage of the access circuit, and if the output voltage does not exceed a predetermined value, the predetermined data stored in the resistive random memory sensor is not changed.

2. The sensing device as claimed in claim 1, wherein the controller generates a calibration signal based on the comparison result to calibrate a writing current or a writing voltage of the access circuit.

3. The sensing device as claimed in claim 1, wherein the access circuit comprises a read circuit and a write circuit.

4. The sensing device as claimed in claim 1, wherein the access circuit is able to output a third writing voltage corresponding to the first logic data, a fourth writing voltage corresponding to a second logic data, and the third writing voltage is smaller than the fourth writing voltage.

5. The sensing device as claimed in claim 1, wherein the resistive random memory sensor senses a temperature variation, and wherein the temperature variation is greater than a predetermined value, the predetermined data stored in the resistive random memory sensor is changed.

6. The sensing device as claimed in claim 1, wherein the resistive random memory sensor comprises at least one resistive memory cell to store the predetermined data.

7. A sensing device, comprising:
   a controller;
   a writing circuit to output a first writing voltage corresponding to a first logic data, and a second writing voltage corresponding to a second logic data, wherein the first writing voltage is smaller than the second writing voltage;
   a first resistive random memory sensor storing a first predetermined data to determine whether the first writing voltage is larger than a first determined voltage;
   a second resistive random memory sensor storing a second predetermined data to determine whether the second writing voltage is larger than a second determined voltage;
   a read circuit to read data stored in the first resistive random memory sensor and the second resistive random memory sensor; and
   a comparator circuit to compare a first data with the first predetermined data to output a first comparison result, compare a second data with the second predetermined data to output a second comparison result, wherein the read circuit reads the first resistive random memory and the second resistive random memory to get the first data and the second data, and the controller adjusts the first writing voltage and the second writing voltage based on the first comparison result and the second comparison result.

* * * * *